United States Patent
Shimizu

(10) Patent No.: US 8,520,354 B2
(45) Date of Patent: *Aug. 27, 2013

(54) MULTILAYERED BOARD SEMICONDUCTOR DEVICE WITH BGA PACKAGE

(75) Inventor: Tadashi Shimizu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/584,083

(22) Filed: Aug. 13, 2012

(65) Prior Publication Data

US 2012/0306099 A1    Dec. 6, 2012

Related U.S. Application Data

(62) Division of application No. 13/045,264, filed on Mar. 10, 2011, now Pat. No. 8,274,773.

(30) Foreign Application Priority Data

Mar. 12, 2010 (JP) ................................ 2010-055682

(51) Int. Cl.
*H02H 9/06* (2006.01)
(52) U.S. Cl.
USPC .......................................... 361/117; 361/118
(58) Field of Classification Search
USPC ................................. 361/118, 111
See application file for complete search history.

(56) References Cited

U.S. PATENT DOCUMENTS

| 6,218,631 | B1 | 4/2001 | Hetzel | |
|---|---|---|---|---|
| 6,954,346 | B2 | 10/2005 | Anthony | |
| 6,985,111 | B2 | 1/2006 | Hara et al. | |
| 7,193,831 | B2 * | 3/2007 | Anthony | ........................ 361/118 |
| 7,443,647 | B2 | 10/2008 | Anthony | |

FOREIGN PATENT DOCUMENTS

| JP | 11-340636 A | 12/1999 |
|---|---|---|
| JP | 2003218541 A | 7/2003 |
| JP | 2004-363392 A | 12/2004 |
| JP | 2004363347 A | 12/2004 |

* cited by examiner

*Primary Examiner* — Howard Weiss
*Assistant Examiner* — Steven Rao
(74) *Attorney, Agent, or Firm* — Foley & Lardner LLP

(57) ABSTRACT

In a lamination type semiconductor device, in the case where a power source plane is wrapped by a closed area to prevent the needless radiation from being leaked to the outside of the semiconductor package, a planar conductor for shield having an area intersecting with the respective layers is required. However, in a device for manufacturing the lamination type semiconductor device, a process for manufacturing the above-mentioned conductor cannot be realized ordinarily. In order to make the process possible, it is required to modify or replace a manufacturing apparatus of the semiconductor device, and accordingly a manufacturing cost will be considerably increased. In the present invention, a guard ring is arranged in an surrounding area of a power source plane. The guard ring is connected to a GND plane of another layer through a via. Consequently, the RF radiation occurs between the power source plane and the guard ring.

6 Claims, 4 Drawing Sheets

MULTILAYERED BOARD SEMICONDUCTOR DEVICE WITH BGA PACKAGE

CROSS-REFERENCE TO RELATED PATENT APPLICATIONS

Japan Priority Application 2010-055682, filed Mar. 12, 2010 including the specification, drawings, claims and abstract, is incorporated herein by reference in its entirety. This application is a Divisional of U.S. application Ser. No. 13/045,264, filed Mar. 10, 2011, incorporated herein by reference in its entirety.

BACKGROUND OF THE INVENTION

1. Field of the Invention

The present invention relates to a semiconductor device. In particular, the present invention relates to a semiconductor device using a multilayer board.

2. Description of Related Art

In a multilayer board of a semiconductor device using a BGA (Ball Grid Array) package, a power source plane and a GND (Ground) plane are generally provided in an inner layer. The general power source plane and the GND plane are each a sheet of conductor that spreads to be an area being as large as possible in the layer, basically.

Generally, the general power source plane and the GND plane are opposed to each other in a same area. This causes a generation of needless RF (radio frequency) radiation due to the electromagnetic coupling between these two planes. In this case, since radiated to the outside of a package of the semiconductor device, there is a possibility that the RF radiation badly affects external circuits or device.

As a method for preventing the RF radiation from being leaked to the outside of the semiconductor device, a technique for wrapping the power source plane with another conductor, for example, is known.

Regarding the above description, Patent Document 1 (Japanese Patent Application Publication JP2003-218541A) discloses a description according to an EMI reducing structure board. The EMI reducing structure board includes a sheet conductor for power source, a dielectric substance, two sheets of sheet conductors for ground, and a sheet conductor for connection. Here, the dielectric substance entirely wraps the surface of the sheet conductor for power source. Moreover, two sheets of the sheet conductors for ground and the sheet conductor for connection configure one conductor of closed area, and the closed area conductor further wraps the sheet conductor for power source wrapped by the dielectric substance. That is, two sheets of the sheet conductor for ground sandwich the sheet conductor for power source wrapped by the dielectric substance from the surface and the reverse surface. The sheet conductor for connection is connected to two sheets of the sheet conductor for ground, and entirely surrounds side surfaces of the sheet conductor for power source wrapped by the dielectric substance.

In addition, Patent Document 2 (Japanese Patent Application Publication JP2004-363347A) discloses a description regarding a multilayer printed circuit board. The multilayer printed circuit board includes signal layers, two sheets of power source layers, insulation layers, two sheets of ground layers, and a shield. Here, two sheets of the power source layers are arranged to be parallel with and to be separated from each other. The signal layers are arranged between two sheets of the power source layers to be parallel with and to be separated from each other. The insulator of the insulation layers entirely wraps the surfaces of the power source layers and signal layers. Two sheets of the ground layers and the shield are connected and configure one conductor of closed area, and the closed area conductor further wraps the power source layers and signal layers each wrapped by the insulator. That is, two sheets of the ground layers sandwich the insulator wrapping these power source layers and signal layers from the surface and reverse surface thereof. The shield is connected to two sheets of the ground layers, and entirely surrounds side surfaces of the power source layers and signal layers wrapped by the insulator.

SUMMARY

In a lamination type semiconductor device, in the case where a power source plane is wrapped by a closed area to prevent the needless radiation from being leaked to the outside of the semiconductor package, a planar conductor for shield having an area intersecting with the respective layers is required. However, in a device for manufacturing the lamination type semiconductor device, a process for manufacturing the above-mentioned conductor cannot be realized ordinarily. In order to make the process possible, it is required to modify or replace a manufacturing apparatus of the semiconductor device, and accordingly a manufacturing cost will be considerably increased.

According to an aspect of the present invention, a semiconductor device includes: a first conductive plane on which a first voltage is applied; a second conductive plane on which a second voltage is applied; an insulator arranged between the first conductive plane and the second conductive plane; a guard ring arranged in a same conductor layer to the second conductive plane and in a surrounding area of the second conductive plane with a clearance therebetween; and a via connecting the first conductive plane and the guard ring through the insulator. The gap is smaller than a thickness of the insulator between the first conductive plane and the second conductive plane.

According to the present invention, a guard ring is arranged in an surrounding area of a power source plane. The guard ring is connected to a GND plane of another layer through a via. As a result, the RF radiation occurs between the power source plane and the guard ring so that it is possible to suppress the irradiation of needless radiation to the outside of the package.

A semiconductor device according to the present invention is able to suppress emission of needless radiation to the outside of a package without considerably increasing a manufacturing cost.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

Referring to attached drawings, embodiments for carrying out a semiconductor device according to the present invention will be explained below.

Figure 1:
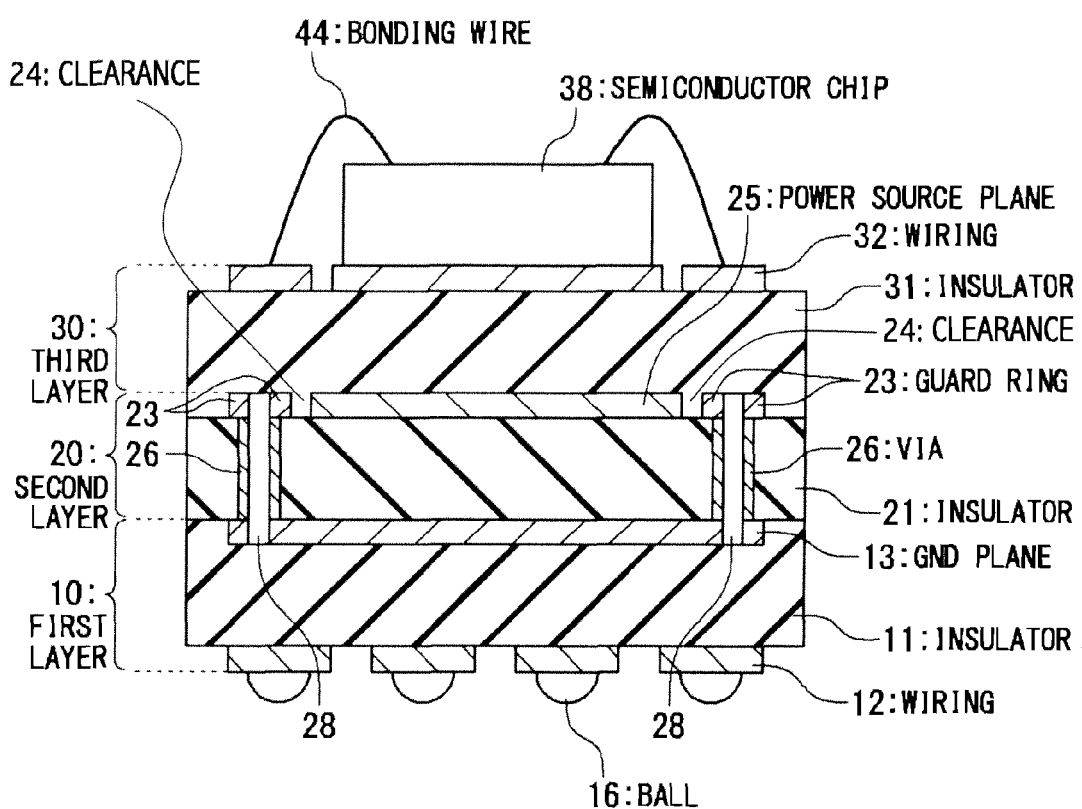
FIG. 1 is a cross sectional view schematically showing an example of overall configuration of a semiconductor device according to an embodiment of the present invention.

FIG. 1 is a cross sectional view schematically showing an example of overall configuration of the semiconductor device according to an embodiment of the present invention. The semiconductor device of FIG. 1 includes: BGA balls 16; a first layer 10, a second layer 20, and a third layer 30 of a multilayer board; a semiconductor chip 38; and bonding wires 44.

The first layer 10 includes first wirings 12, a first insulator 11, and a GND plane 13. The second layer 20 includes a second insulator 21, vias 26, a power source plane 25, and a guard ring 23. There is a gap clearance between the guard ring 23 and the power source plane 25 as described below. The third layer 30 includes a third insulator 31 and second wirings 32.

The balls 16, the first wirings 12, the first insulator 11, the GND plane 13, the second insulator 21, the power source plane 25, the third insulator 31, the second wiring 32, and the semiconductor chip 38 are stacked in layers in this order from the bottom. The guard ring 23 is arranged in the same wiring layer as that of the power source plane 25. In addition, each of the vias 26 is arranged in the same layer as that of the insulator 21. Each of the vias 26 is composed of conductor formed to be a ring-shape along a side wall of an opening part provided to the insulator 21, and the inside is filled with a via filler 28. The via filler 28 may be a conductive material and may be an insulating material. In the case where the via filler 28 is insulating material, the insulator 11 or the insulator 31 may be filled. Moreover, the vias 26 and the guard ring 23 may be formed in the same process.

The ball 16 is connected to the first wiring 12. The first wiring 12 may be partially covered with a solder resist that is not shown in the drawing. The power source plane 25 is connected to any of the balls 16 through a via that is not shown in the drawing. The GND plane 13 is connected to any of the balls 16 through the via that is not shown in the drawing. The GND plane 13 is connected to the guard ring 23 through the vias 26. An electronic circuit of the semiconductor chip 38, the circuit being not shown in the drawing, is electrically connected to the second wirings 32 via the bonding wires 44.

Figure 2:
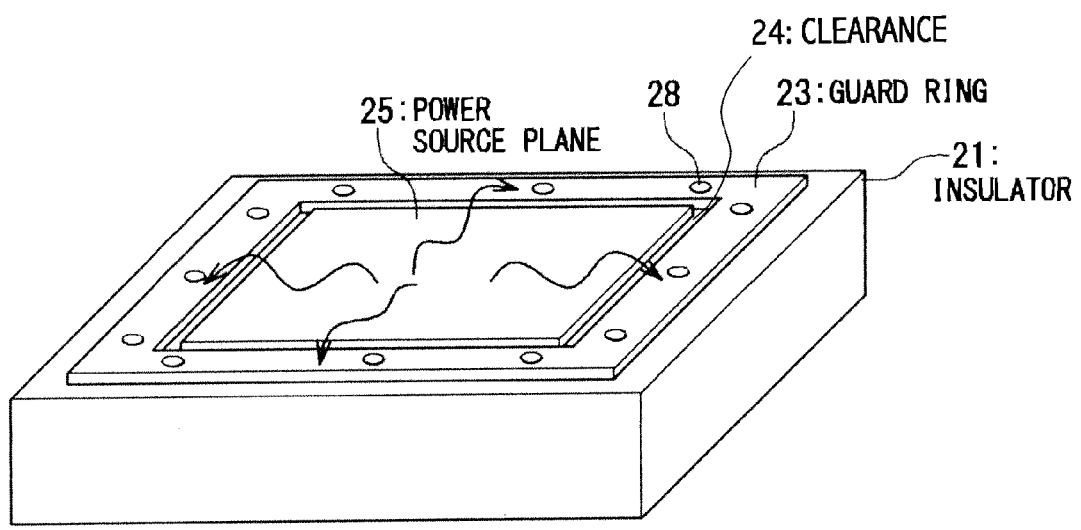
FIG. 2 is a bird's-eye view illustrating by picking out an insulator, a power source plane, and a guard ring of the semiconductor device according to the embodiment of the present invention.

FIG. 2 is a bird's-eye view illustrating by picking out the insulator 21, the power source plane 25, and the guard ring 23 of the semiconductor device according to this embodiment of the present invention. FIG. 2 only shows the insulator 21, the power source plane 25, and the guard ring 23, and other components are not represented.

The guard ring 23 is arranged in the surrounding area of the power source plane 25. A sufficient clearance 24 is provided between the guard ring 23 and the power source plane 25, and thus the insulation is ensured. In a part of the guard ring 23, a part of the via fillers 28 is exposed.

In FIG. 2, a state of propagation of an electromagnetic wave due to an RF noise caused by the power source plane 25 is schematically shown by arrows. The electromagnetic wave is terminated at the guard ring 23 due to the potential difference between the guard ring 23 and the power source plane 25. Since the power source plane 25 and the guard ring 23 are closely arranged with each other, it can be suppressed that the electromagnetic wave wraps around other region than the power source plane 25 and the guard ring 23.

An example of sizes of the respective components will be shown below. In the semiconductor device according to this embodiment of the present invention, the following values can be adopted; for example, an external dimension of the laminated board is substantially 35 mm×35 mm, the thicknesses of the insulators 11, 21, and 31 are substantially 150 μm, the dielectric constants of the insulators 11, 21, and 31 are substantially 4, the thicknesses of the wiring 12, the power source plane 25, the GND plane 13, and the wiring 32 are substantially 35 μm, the width of the guard ring 23 is substantially 500 nm, the clearance 24 between the guard ring 23 and the power source plane 25 is substantially 100 μm. In particular, in order to prevent the generation of the RF radiation between the GND plane 13 and the power source plane 25, it is important that the clearance separating the guard ring 23 from the power source plane 25 is narrower than the thickness of the insulator 21 that separates the GND plane 13 from the guard rings 23. The potential difference between the power source plane 25 and the GND plane 13 can be set to substantially 3.3V or less.

Figure 3:
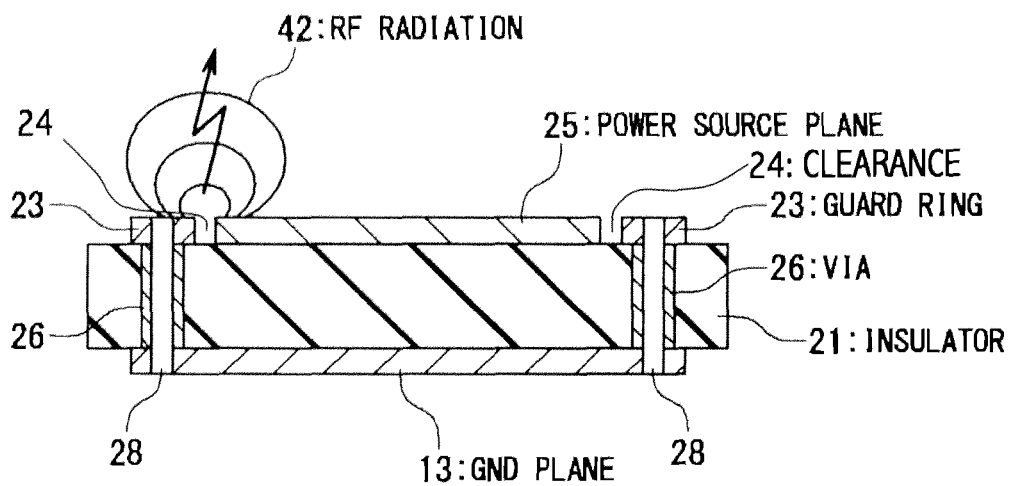
FIG. 3 is a cross section schematically showing an RF radiation irradiated from the semiconductor device according to the embodiment of the present invention.

FIG. 3 is a cross section schematically showing the RF radiation 42 irradiated from the semiconductor device according to this embodiment of the present invention. FIG. 3 only shows the GND plane 13, the insulator 21, the guard ring 23, the power source plane 25, the via fillers 28, and the vias 26, and other components are not represented.

As shown in FIG. 3, in the semiconductor device according to this embodiment of the present invention, the RF radiation 42 is generated between the power source plane 25 and the guard ring 23. For this reason, in the semiconductor device according to this embodiment of the present invention, the RF radiation 42 is hard to be leaked to the outside, which is different from the RF radiation 41 of a comparative example shown in FIG. 6 explained later.

In order to strengthen this effect, the dielectric constant of the second insulator 21, for example, may be set to a larger value than those of the first insulator 11 and third insulator 31.

It is desired that the plurality of vias 26 are provided in order to prevent the voltage in the guard ring 23 from being floated and that the distance between the vias 26 is so closed that the purpose can be achieved. However, the distance between the vias 26 is not required, for example, to be a half wavelength or less of a frequency of RF radiation.

The above-mentioned via 26 can be easily provided by a common device for manufacturing the lamination type semiconductor device.

Figure 4:
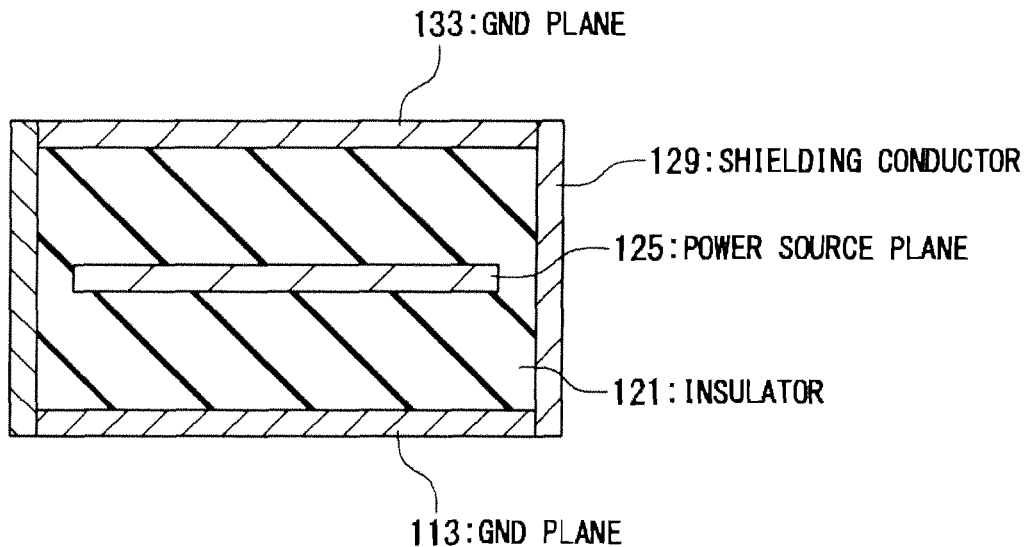
FIG. 4 is a cross sectional view schematically showing a configuration of a semiconductor device according to Patent Document 1.

FIG. 4 is a cross sectional view schematically showing the configuration of the semiconductor device according to Patent Document 1. The semiconductor device of FIG. 4 includes a power source plane 125, a first GND plane 113, a second GND plane 133, a shielding conductor 129, and an insulator 121. In FIG. 4, other components are not represented.

In the semiconductor device of FIG. 4, the power source plane 125 is entirely wrapped by a conductor of closed area including the first and second GND planes 113 and 133 and the shielding conductor 129. The insulator 121 is arranged between the power source plane 125 and the conductor of closed area.

In terms of the manufacturing method of the semiconductor device, the GND planes 113 and 133, the power source plane 125, and the insulator 121 can be easily manufactured even in a common manufacturing device. However, since having an area perpendicular to the respective layers of the lamination type semiconductor device, it is hard or impossible for a common semiconductor manufacturing device to manufacture the shielding conductor 129. Even when the shielding conductor 129 could be manufactured by using a special device, the manufacturing cost will become high.

The semiconductor device of Patent Document 2 is configured by adding a second power source plane and a signal wiring inside the conductor of closed area of the semiconductor device of FIG. 4. Accordingly, in terms of the manufacturing method and the manufacturing cost, the Patent Document 2 is the same as the semiconductor device of Patent Document 1.

In comparison with the semiconductor device of FIG. 4, the semiconductor device of this embodiment has the configuration to suppress the leakage of the RF radiation 42 to the outside, and additionally does not require a conductor corresponding to the shielding conductor. Instead, the semiconductor device of this embodiment is provided with the guard ring 23 and vias 26 as components other than those of the common semiconductor device. The guard ring 23 and the vias 26 can be easily manufactured by a common semiconductor manufacturing device, and accordingly the increase of the manufacturing cost can be avoided.

In the semiconductor device according to this embodiment of the present invention, if voltages applied to the GND plane 13 and the power source plane 25 are reversed, the effect of this embodiment is not changed. In other words, the semiconductor device of this embodiment may have a configuration where a guard ring connected through the vias to the power source plane is arranged in the surrounding area of the GND plane.

Moreover, if a conductor layer where the GND plane 13 is arranged and the conductor layer where the power source plane 25 and the guard ring 23 are arranged are exchanged each other, the effect of this embodiment is not changed. In addition, in FIG. 1, the GND plane may be added between the wiring 32 and the power source plane 25, and the GND plane may be further added between the wiring 12 and the GND plane 13. In this manner, the leakage of the RF radiation 42 to the outside can be further suppressed.

COMPARATIVE EXAMPLE

Figure 5:
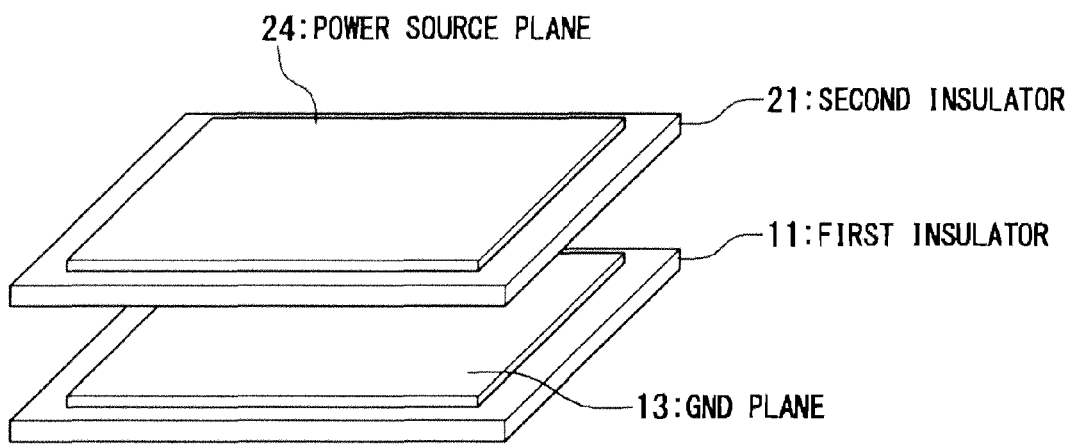
FIG. 5 is a bird's-eye view schematically showing a configuration of a power source plane and a GND plane in a semiconductor device according to a comparative example.

FIG. 5 is a bird's-eye view schematically showing a configuration of a power source plane 24 and a GND plane 13 in a semiconductor according to a comparative example. The semiconductor device of FIG. 5 includes the power source plane 24, the GND plane 13, a first insulator 11, and a second insulator 21. Other components of the semiconductor device are not represented in FIG. 5.

The first insulator 11 is arranged in a layer lower than the GND plane 13. The second insulator 21 is arranged between the power source plane 24 and the GND plane 13. In an actual semiconductor device, the first insulator 11, the GND plane 13, the second insulator 21, and the power source plane 24 are closely stacked in layers in this order from the bottom. In FIG. 5, a clearance between the second insulator 21 and the first insulator 11 is shown by being enlarged to show a shape of the GND plane 13.

Figure 6:
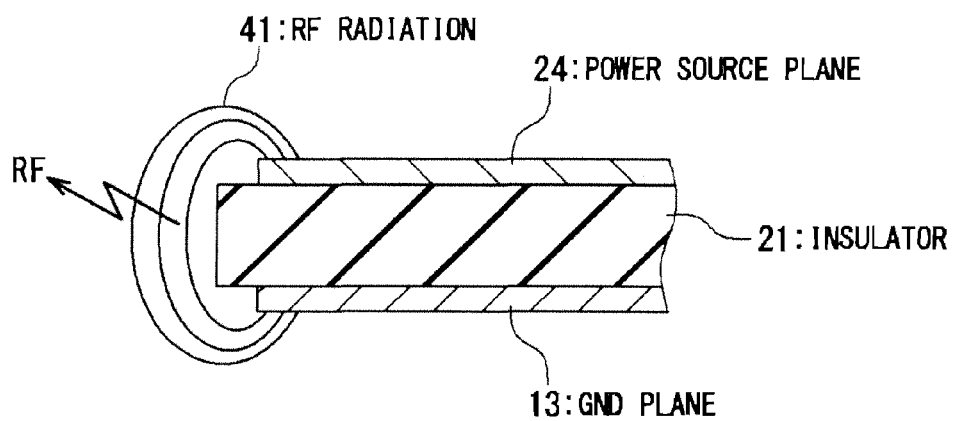
FIG. 6 is a cross sectional view schematically showing RF radiation irradiated from the semiconductor device according to the comparative example.

FIG. 6 is a cross sectional view schematically showing an RF (Radio Frequency) radiation 41 radiated from a semiconductor device of the reference technique. The semiconductor device of FIG. 6 has the same configuration as that of the semiconductor device of FIG. 5; however, the first insulator 11 is not represented in FIG. 6.

Since the power source plane 24 and the GND plane 13 are opposed to each other in a same area, the RF radiation 41 that is needless radiation is generated due to the electromagnetic coupling. On this occasion, since radiated to the outside of a package of the semiconductor device, there is a possibility that the RF radiation 41 badly affects external circuits or devices.

Meanwhile, according to the present invention, as shown in FIG. 3, the RF radiation is hard to be leaked to the outside, which is different from the RF radiation 41.

What is claimed is:

1. A semiconductor device comprising:
a wiring board having a first main surface and a second main surface opposing the first main surface;
a semiconductor chip mounted on the first main surface;
a first conductive pattern provided in the wiring board;
a second conductive pattern provided in the wiring board;
a third conductive pattern arranged in a same layer to the second conductive pattern and in a surrounding area of the second conductive pattern;
a first insulator arranged between the first conductive pattern and the second conductive pattern;
a second insulator arranged between the first main surface and the second conductive pattern; and
a via connecting the first conductive pattern and the third conductive pattern through the first insulator, wherein
the second pattern is separated from the third pattern with the second insulator.

2. The semiconductor device according to claim 1, wherein a first voltage is applied on the first conductive pattern; and a second voltage is applied on the second conductive pattern.

3. The semiconductor device according to claim 1, wherein the first conductive pattern is grounded, and
a power source voltage is applied to the second conductive pattern.

4. The semiconductor device according to claim 1, wherein a power source voltage is applied to the first conductive pattern, and
the second conductive pattern is grounded.

5. The semiconductor device according to claim 1, further comprising:
a third insulator arranged between the first conductive pattern and the second main surface;
the second insulator laminated on an upper side of the second conductive pattern and has a lower relative permittivity than the first insulator; and
the third insulator laminated on a lower side of the first conductive pattern and has a lower relative permittivity than the first insulator.

6. The semiconductor device according to claim 2, further comprising:
another via connecting the first conductive pattern and the third conductive pattern through the first insulator; and
the via and the another via are arranged such that the first voltage does not float on the third conductive pattern.

* * * * *